(12) United States Patent
Stamper et al.

(10) Patent No.: US 7,432,191 B1
(45) Date of Patent: Oct. 7, 2008

(54) METHOD OF FORMING A DUAL DAMASCENE STRUCTURE UTILIZING A DEVELOPABLE ANTI-REFLECTIVE COATING

(75) Inventors: Harlan D. Stamper, Poughkeepsie, NY (US); Shannon W. Dunn, Altamont, NY (US); Sandra Hyland, Falls Church, VA (US)

(73) Assignee: Tokyo Electron Limited, Tokyo (JP)

( * ) Notice: Subject to any disclaimer, the term of this patent is extended or adjusted under 35 U.S.C. 154(b) by 49 days.

(21) Appl. No.: 11/694,623

(22) Filed: Mar. 30, 2007

(51) Int. Cl.
*H01L 23/52* (2006.01)
(52) U.S. Cl. .................. 438/624; 438/633; 438/638; 257/E21.579; 716/21
(58) Field of Classification Search .............. 438/624, 438/633, 638, FOR. 355; 257/E21.579; 716/21
See application file for complete search history.

(56) References Cited

U.S. PATENT DOCUMENTS

| 6,844,131 | B2* | 1/2005 | Oberlander et al. ...... 430/270.1 |
| 6,844,143 | B2* | 1/2005 | Lin et al. ................... 430/317 |
| 2003/0129531 | A1* | 7/2003 | Oberlander et al. ...... 430/271.1 |
| 2003/0215736 | A1* | 11/2003 | Oberlander et al. ...... 430/270.1 |
| 2004/0009434 | A1* | 1/2004 | Lin et al. ................... 430/312 |
| 2005/0214674 | A1* | 9/2005 | Sui et al. .................. 430/270.1 |
| 2006/0063105 | A1* | 3/2006 | Oberlander et al. ...... 430/270.1 |
| 2007/0224816 | A1* | 9/2007 | Uh et al. .................... 438/689 |
| 2008/0020327 | A1* | 1/2008 | Yang et al. ................. 430/313 |
| 2008/0038666 | A1* | 2/2008 | Wu et al. ................. 430/287.1 |
| 2008/0145793 | A1* | 6/2008 | Patel et al. ................. 430/311 |

* cited by examiner

*Primary Examiner*—George Fourson
(74) *Attorney, Agent, or Firm*—Wood, Herron & Evans, LLP

(57) ABSTRACT

A method of patterning a structure in a thin film on a substrate is described. A film stack on the substrate includes the thin film on the substrate, a developable anti-reflective coating (ARC) layer on the thin film, and a first photo-resist layer on the developable ARC layer. The first photo-resist layer and the developable ARC layer are imaged with a first image pattern and developed to form the first image pattern in the first photo-resist layer and the developable ARC layer. Thereafter, the first photo-resist layer is removed, and the developable ARC layer is modified by thermal treatment. A second photo-resist layer is then formed on the modified ARC layer, and the second photo-resist layer is imaged with a second image pattern and developed to form the second image pattern in the second photo-resist layer. The first and second image patterns are then transferred to the thin film.

16 Claims, 5 Drawing Sheets

METHOD OF FORMING A DUAL DAMASCENE STRUCTURE UTILIZING A DEVELOPABLE ANTI-REFLECTIVE COATING

CROSS-REFERENCE TO RELATED APPLICATIONS

This application is related to pending U.S. patent application Ser. No. 11/623,237, entitled "METHOD OF DOUBLE PATTERNING A THIN FILM USING A DEVELOPABLE ANTI-REFLECTIVE COATING AND A DEVELOPABLE ORGANIC PLANARIZATION LAYER" (TTCA-165), filed on Jan. 15, 2007; pending U.S. patent application Ser. No. 11/623,247, entitled "METHOD OF PATTERNING AN ORGANIC PLANARIZATION LAYER" (TTCA-166), filed on Jan. 15, 2007; pending U.S. patent application Ser. No. 11/534,261, entitled "METHOD AND SYSTEM FOR DOUBLE IMAGING A DEVELOPABLE ANTI-REFLECTIVE COATING" (TTCA-157), filed on Sep. 22, 2006; pending U.S. patent application Ser. No. 11/534,365, entitled "METHOD AND SYSTEM FOR DOUBLE PATTERNING A DEVELOPABLE ANTI-REFLECTIVE COATING" (TTCA-158), filed on Sep. 22, 2006; pending U.S. patent application Ser. No. 11/534,420, entitled "METHOD OF PATTERNING AN ANTI-REFLECTIVE COATING BY PARTIAL ETCHING" (TTCA-159), filed on Sep. 22, 2006; pending U.S. patent application Ser. No. 11/534,477, entitled "METHOD OF PATTERNING A DEVELOPABLE ANTI-REFLECTIVE COATING BY PARTIAL DEVELOPING" (TTCA-160), filed on Sep. 22, 2006; and pending U.S. patent application Ser. No. 11/534,538, entitled "METHOD FOR DOUBLE PATTERNING A THIN FILM" (TTCA-161), filed on Sep. 22, 2006. The entire contents of these applications are herein incorporated by reference in their entirety.

BACKGROUND OF THE INVENTION

1. Field of the Invention

The present invention relates to a method for patterning a thin film on a substrate, and more particularly to a method for patterning a dual damascene structure in a thin film on a substrate.

2. Description of Related Art

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

More recently, in order to meet the increasing demand to produce smaller features, the use of multi-layer masks has become more prevalent. By utilizing a multi-layer mask, the top mask layer, which comprises a light-sensitive material as described above, may be thinner and, hence, a smaller feature size may be achieved using conventional photo-lithography techniques. However, in order to generate a mask layer of sufficient thickness for the ensuing primary etch process, additional material layers are formed underlying the top mask layer. The pattern, formed in the top mask layer using lithographic techniques, is transferred to the underlying layer or layers that comprise the mask layer for the primary etch process using dry processing, such as additional etching processes.

SUMMARY OF THE INVENTION

The present invention relates to a method for patterning a thin film on a substrate.

According to one embodiment, a method of patterning a dual damascene structure in a thin film is described.

According to another embodiment, a method of, and computer readable medium for, patterning a thin film on a substrate is described. The method comprises preparing a film stack on the substrate, the film stack comprising the thin film formed on the substrate, a developable anti-reflective coating (ARC) layer formed on the thin film, and a first layer of photo-resist formed on the developable ARC layer. The first layer of photo-resist and the developable ARC layer are imaged with a first image pattern. Then, the first layer of photo-resist and the developable ARC layer are developed to form the first image pattern in the first layer of photo-resist and the developable ARC layer. Thereafter, the first layer of photo-resist is removed, and the developable ARC layer is modified to form a modified ARC layer using a thermal treatment process. Following the thermal treatment process, a second layer of photo-resist is formed on the modified ARC layer, and the second layer of photo-resist is imaged with a second image pattern. The second layer of photo-resist is developed to form the second image pattern in the second layer of photo-resist. The first image pattern and the second image pattern are transferred to the thin film using one or more etching processes.

According to another embodiment, a method of forming a dual damascene structure is described, comprising: preparing a film stack on a substrate, the film stack comprising a thin film formed on the substrate, a developable anti-reflective coating (ARC) layer formed on the thin film, and a first layer of photo-resist formed on the developable ARC layer; forming a via pattern in the first layer of photo-resist and the developable ARC layer; removing the first layer of photo-resist; modifying the developable ARC layer using a thermal treatment process; forming a second layer of photo-resist on the modified ARC layer; forming a trench pattern in the second layer of photo-resist; and transferring the via pattern and the trench pattern to the thin film using one or more etching processes to form the dual damascene structure. The invention further includes a computer readable medium containing program instructions for execution on a control system, which when executed by the control system, cause a patterning system to perform the above-described method steps.

DETAILED DESCRIPTION OF EXEMPLARY EMBODIMENTS

In the following description, for purposes of explanation and not limitation, specific details are set forth, such as particular processes and patterning systems. However, it should be understood that the invention may be practiced in other embodiments that depart from these specific details.

Figure 1A:
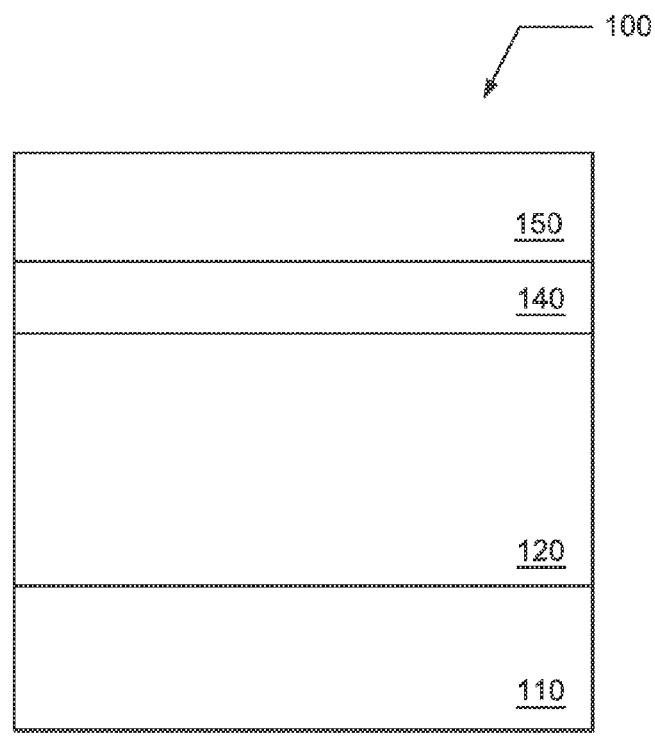
FIGS. 1A through 1H illustrate schematically a method for patterning a thin film on a substrate according to an embodiment.
Figure 1B:
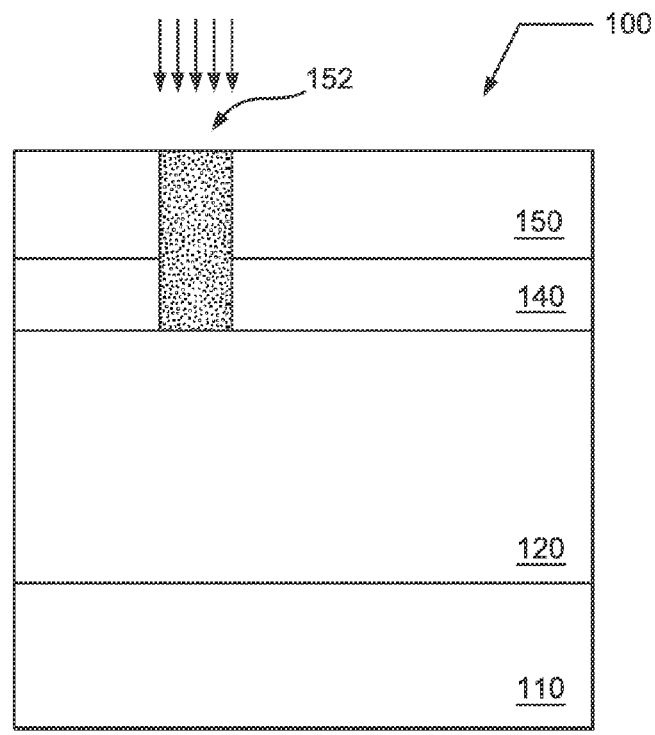
Figure 1C:
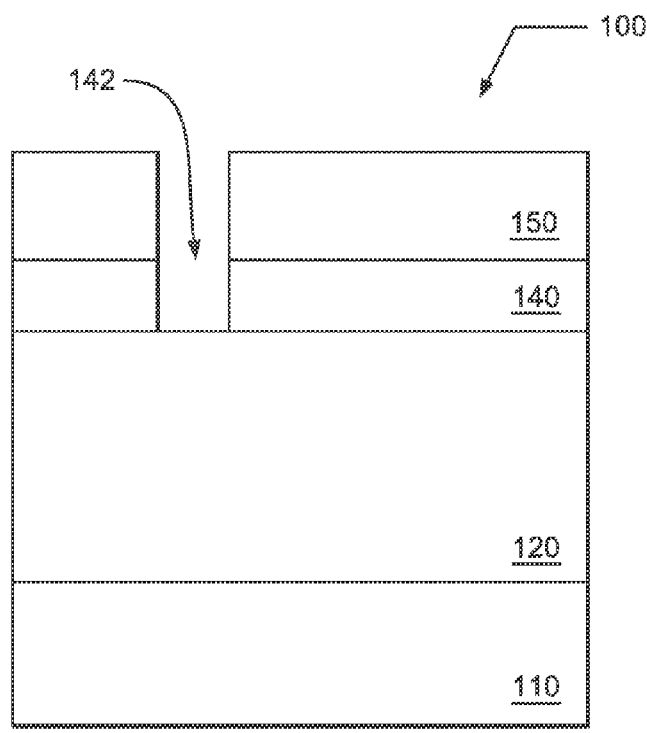
Figure 1D:
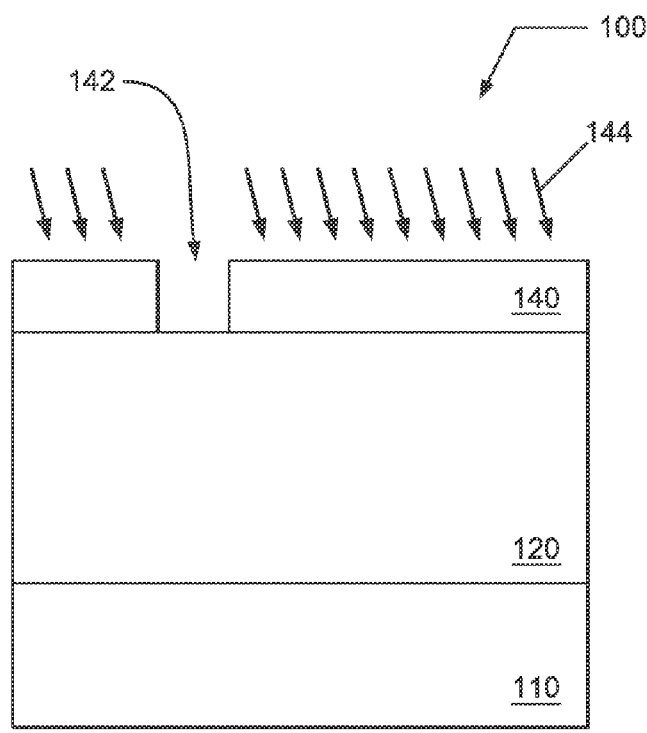
Figure 1E:
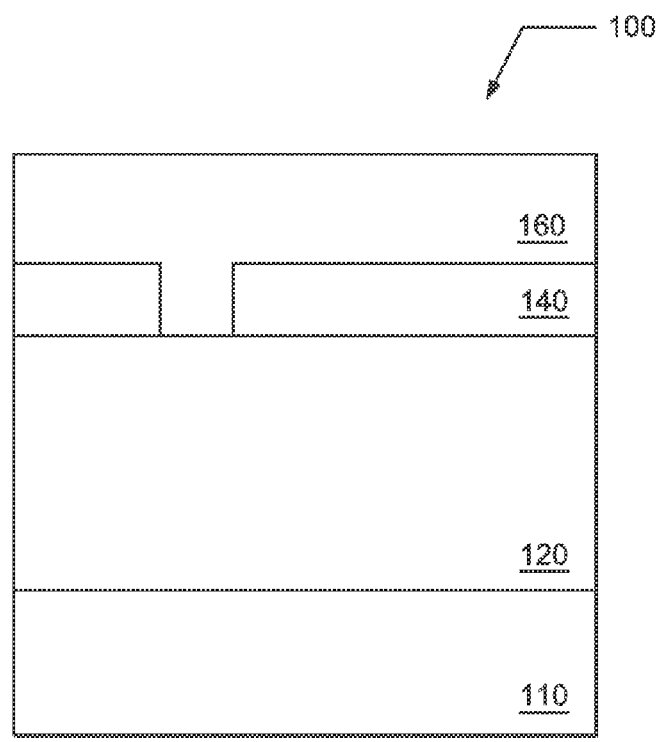
Figure 1F:
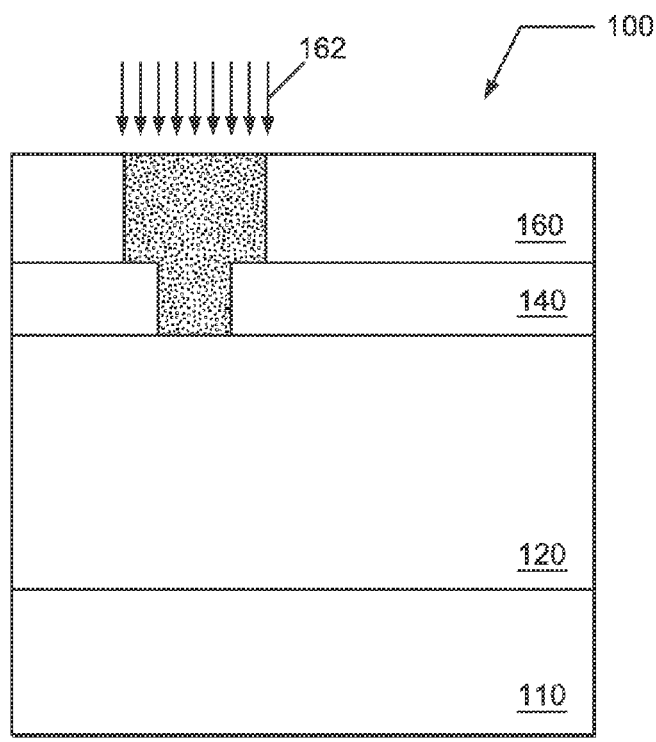
Figure 1G:
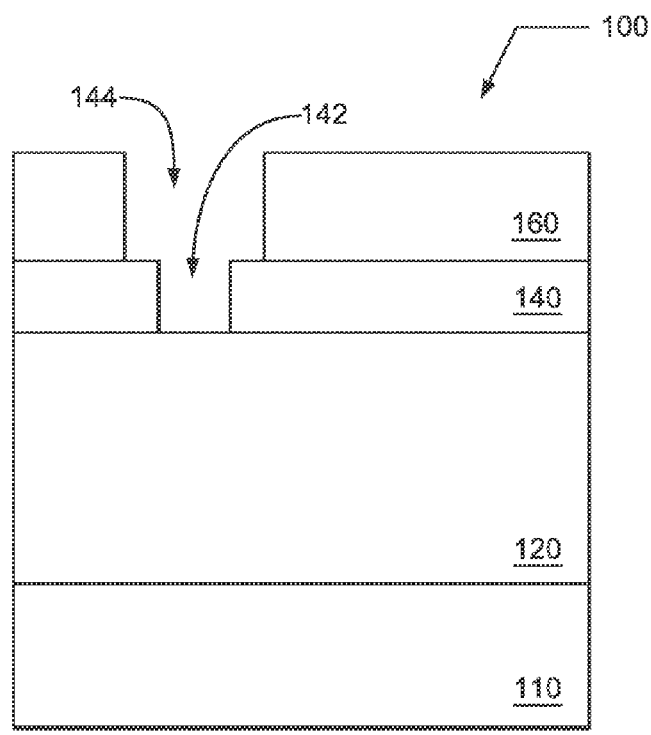
Figure 1H:
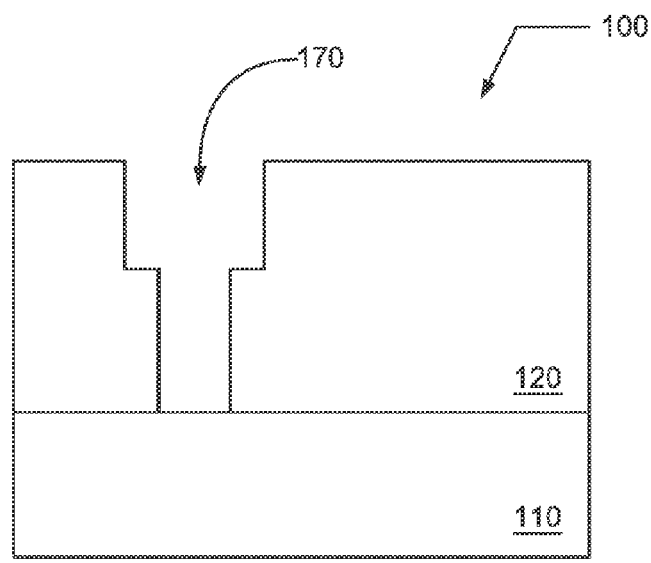
Figure 2:
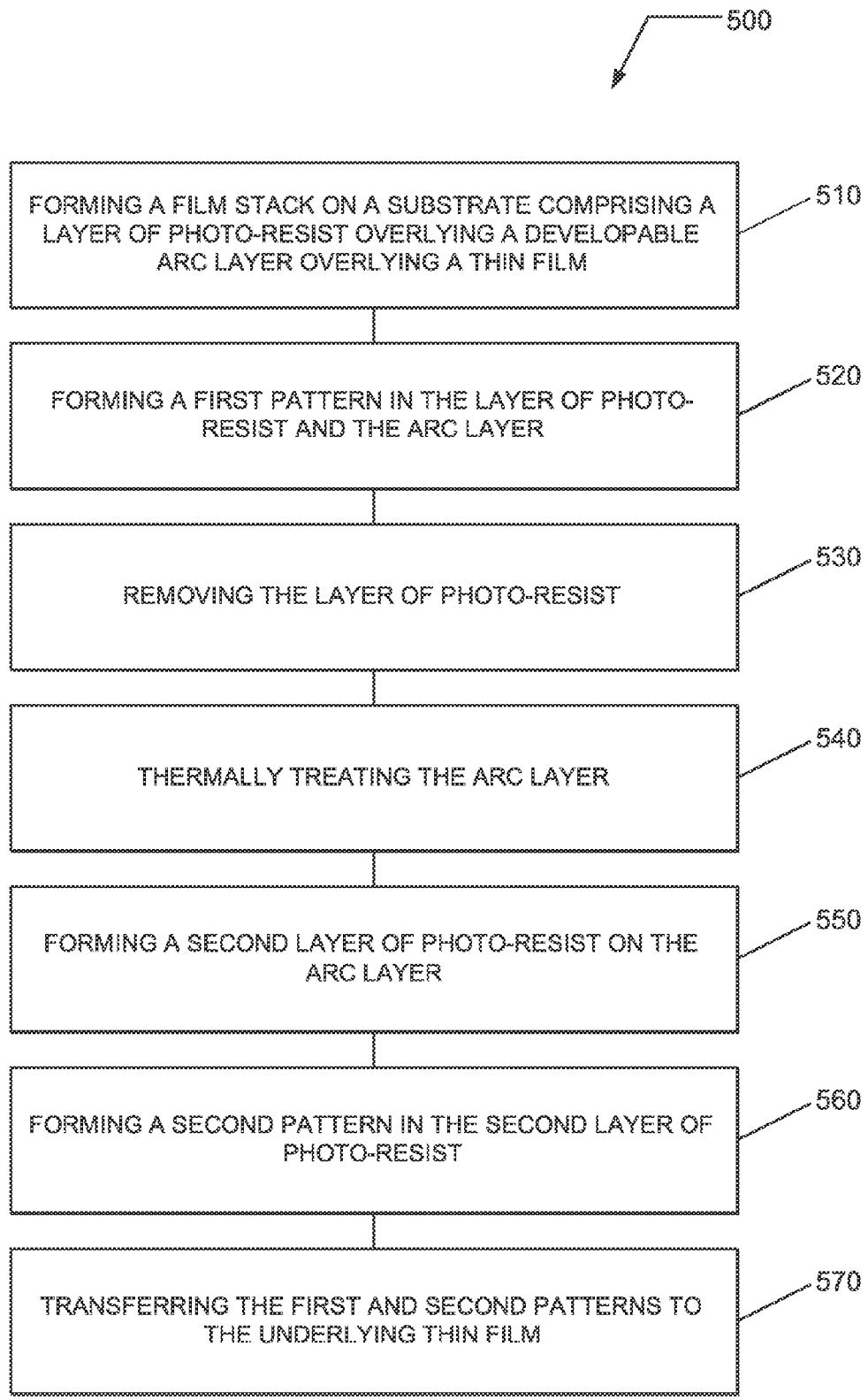
FIG. 2 illustrates a flow chart of a method for patterning a thin film on a substrate according to an embodiment.

According to an embodiment, a method of patterning a structure in a substrate is schematically illustrated in FIGS. 1A through 1H, and is illustrated in a flow chart 500 in FIG. 2. For example, the structure can include a trench-via structure, or dual damascene structure. The method begins in 510 with forming a lithographic structure 100 comprising a film stack formed on substrate 110. The film stack comprises a thin film 120 formed on substrate 110, a developable anti-reflective coating (ARC) layer 140 formed on the thin film 120, and a first layer of photo-resist 150 formed on the developable ARC layer 140. The film stack may include additional layers. For example, the film stack may optionally comprise an organic planarization layer (OPL) (not shown) disposed between the thin film 120 and the developable ARC layer 140.

The thin film 120 may comprise a conductive layer, a non-conductive layer, or a semi-conductive layer. For instance, the thin film 120 may include a material layer, or plurality of material layers, comprising a silicon-containing material, such as silicon dioxide, silicon nitride, silicon carbide, or silicon oxynitride, etc. Additionally, for instance, the thin film 120 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 120 may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc.

Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3p™ semiconductor dielectric resins commercially available from Honeywell.

The thin film 120 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The developable ARC layer 140 possesses material properties suitable for use as an anti-reflective coating. Additionally, the developable ARC layer 140 comprises a light-sensitive material that, when exposed to electro-magnetic (EM) radiation, is chemically altered and thus configured to be removed using a developing solvent. For example, the developable ARC layer 140 may comprise (wet) developable anti-reflective coatings commercially available from Brewer Science. Inc. (2401 Brewer Drive, Rolla, Mo. 65401). Additionally, the developable ARC layer 140 is selected to be compatible with the overlying photo-resist layer 150 and the lithographic wavelength, i.e., ArF, KrF, etc. The developable ARC layer 140 may, for example, be applied using spin coating technology.

The first photo-resist layer 150 may comprise 248 nm (nanometer) resists, 193 nm resists, 157 nm resists, or EUV (extreme ultraviolet) resists. The photo-resist layer 150 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology. The coating of the photo-resist layer 150 may include any or all processes known to those skilled in the art of preparing such films including, but not limited to, performing a cleaning process prior to the coating process, performing a post-application bake (PAB) following the coating process, etc.

The optional OPL (not shown) can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

In 520 and as shown in FIG. 1B, the photo-resist layer 150 and the developable ARC layer 140 are imaged with a first image pattern 152. For example, the first image pattern 152 comprises a via or contact pattern. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

As illustrated in FIG. 1B, the exposure may extend through the entire thickness of the first photo-resist layer 150 and the developable ARC layer 140. Alternatively, the exposure may extend through the entire thickness of the photo-resist layer 150, and then extend only partially through the thickness of the developable ARC layer 140.

Thereafter, in 520 and as shown in FIG. 1C, the exposed first photo-resist layer 150 and the exposed developable ARC layer 140 are subjected to a developing process in order to remove the first image pattern 152, and form a first pattern 142 in the first photo-resist layer 150 and the developable ARC layer 140. For example, the first pattern 142 comprises a via or contact pattern. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL). The developing of the photo-resist layer 150 may include any or all processes known to those skilled in the art of preparing such films including, but not limited to, performing a post-exposure bake (PEB) prior to the developing process, performing a hard bake following the developing process, etc.

Alternatively, when the image exposure extends partially through the developable ARC layer 140 and this partially exposed region is developed, the developing process leads to the formation of a partially complete pattern in the developable ARC layer 140. The partially complete pattern extends to a depth within the developable ARC layer 140 that is less than the thickness of the developable ARC layer 140. In doing so, the first photo-resist layer 150 may be removed prior to completing the pattern transfer to the developable ARC layer 140, thereby preventing exposure of the thin film 120 to the photo-resist removal process, or the wet process used to extend the pattern through the developable ARC layer 140. The completion of the pattern transfer to the developable ARC layer 140 may be performed using an etching process, such as a dry etching process or a wet etching process. The etching process may be performed immediately following the developing process for the image pattern, for example. Alternatively, the etching process may be performed following the removal of the layer of photo-resist 150.

In 530 and as shown in FIG. 1D, the first layer of photo-resist 150 is removed. For example, the first photo-resist layer 150 may be removed using a wet stripping process, a dry plasma ashing process, or a dry non-plasma ashing process.

Thereafter, in 540 and as shown in FIG. 1D, the patterned, developable ARC layer 140 is thermally treated. The thermal treatment process can include a hard bake process configured to cross-link the patterned, developable ARC layer 140. During the thermal treatment process, the substrate temperature can range from approximately 50° C. to approximately 200° C. and, desirably, the substrate temperature can range from approximately 100° C. to approximately 150° C.

In 550 and as shown in FIG. 1E, a second layer of photo-resist 160 is formed overlying the patterned, developable ARC layer 140. The second photo-resist layer 160 may comprise 248 nm (nanometer) resists, 193 nm resists, 157 nm resists, or EUV (extreme ultraviolet) resists. The second photo-resist layer 160 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

In 560 and as shown in FIG. 1F, the second photo-resist layer 160 is imaged with a second image pattern 162. For example, the second image pattern 162 comprises a trench or line pattern. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

Thereafter, in 560 and as shown in FIG. 1G, the exposed second photo-resist layer 160 is subjected to a developing process in order to remove the second image pattern 162, and form a second pattern 144 in the second photo-resist layer 160. For example, the second pattern 144 comprises a trench or line pattern. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

In 570 and as illustrated in FIG. 2H, the first pattern 142 and the second pattern 144 are transferred to the underlying thin film 120 to form a structure 170 using one or more etching processes. The structure 170 can include a dual damascene structure or a trench-via structure. The one or more etching processes may include any combination of wet or dry etching processes. The dry etching processes may include dry plasma etching processes or dry non-plasma etching processes or combination thereof. The one or more etching processes may be designed to consume the patterned second layer of photo-resist 160 and the patterned, developable ARC layer 140. The one or more etching processes can be configured to selectively etch the thin film 120. The etch selectivity may be adjusted such that the trench pattern is etched into the developable ARC layer 140 once the via pattern reaches a pre-determined depth within the underlying thin film 120.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of patterning a thin film on a substrate, comprising:
preparing a film stack on said substrate, said film stack comprising said thin film formed on said substrate, a developable anti-reflective coating (ARC) layer formed on said thin film, and a first layer of photo-resist formed on said developable ARC layer;
imaging said first layer of photo-resist and said developable ARC layer with a first image pattern;
developing said first layer of photo-resist and said developable ARC layer to form said first image pattern in said first layer of photo-resist and said developable ARC layer;
removing said first layer of photo-resist;
modifying said developable ARC layer to form a modified ARC layer using a thermal treatment process;
forming a second layer of photo-resist on said modified ARC layer;
imaging said second layer of photo-resist with a second image pattern;

developing said second layer of photo-resist to form said second image pattern in said second layer of photo-resist; and transferring said first image pattern and said second image pattern in said second layer of photo-resist and said modified ARC layer to said thin film using one or more etching processes.

2. The method of claim 1, wherein said first image pattern comprises a via pattern, and said second image pattern comprises a trench pattern.

3. The method of claim 1, wherein said transferring said first image pattern and said second image pattern to said thin film facilitates formation of a dual damascene structure in said thin film.

4. The method of claim 1, wherein said modifying said developable ARC layer comprises heating said substrate to a temperature ranging from approximately 50° C. to approximately 200° C.

5. The method of claim 1, wherein said modifying said developable ARC layer comprises heating said substrate to a temperature ranging from approximately 100° C. to approximately 150° C.

6. The method of claim 1, wherein said transferring comprises performing a wet etching process, a dry non-plasma etching process, or a dry plasma etching process, or a combination thereof.

7. The method of claim 1, wherein said preparing said film stack comprises forming a 248 nm photo-resist, a 193 nm photo-resist, a 157 nm photo-resist, or an EUV photo-resist, or a combination of two or more thereof on said developable ARC layer.

8. The method of claim 1, wherein said imaging said first image pattern and said second image pattern comprises imaging an image pattern using a dry lithography system, or a wet lithography system, or both.

9. The method of claim 1, wherein said imaging said first image pattern and said second image pattern comprises imaging an image pattern using a 248 nm photo-lithography system, a 193 nm photo-lithography system, a 157 nm photo-lithography system, or an EUV photo-lithography system, or a combination of two or more thereof.

10. The method of claim 1, wherein said preparing said film stack comprises forming said developable ARC layer configured for 248 nm photo-lithography, 193 nm photo-lithography, 157 nm photo-lithography, or EUV photo-lithography.

11. The method of claim 1, wherein said forming said film stack further comprises forming an organic planarization layer (OPL) on said thin film and forming said developable ARC layer on said OPL.

12. The method of claim 11, further comprising:
transferring said first image pattern and said second image pattern in said second layer of photo-resist and said developable ARC layer to said OPL using one or more etching processes prior to said transferring said first image pattern and said second image pattern to said thin film.

13. A method of forming a dual damascene structure, comprising:
preparing a film stack on a substrate, said film stack comprising a thin film formed on said substrate, a developable anti-reflective coating (ARC) layer formed on said thin film, and a first layer of photo-resist formed on said developable ARC layer;
forming a via pattern in said first layer of photo-resist and said developable ARC layer;
removing said first layer of photo-resist;
modifying said developable ARC layer to form a modified ARC layer using a thermal treatment process;
forming a second layer of photo-resist on said modified ARC layer;
forming a trench pattern in said second layer of photo-resist; and
transferring said via pattern and said trench pattern to said thin film using one or more etching processes to form said dual damascene structure.

14. The method of claim 13, wherein said modifying said developable ARC layer comprises heating said substrate to a temperature ranging from approximately 50° C. to approximately 200° C.

15. The method of claim 13, wherein said modifying said developable ARC layer comprises heating said substrate to a temperature ranging from approximately 100° C. to approximately 150° C.

16. A computer readable medium containing program instructions for execution on a control system, which when executed by the control system, cause a patterning system to perform the steps of:
preparing a film stack on a substrate, said film stack comprising a thin film formed on said substrate, a developable anti-reflective coating (ARC) layer formed on said thin film, and a first layer of photo-resist formed on said developable ARC layer;
forming a via pattern in said first layer of photo-resist and said developable ARC layer;
removing said first layer of photo-resist;
modifying said developable ARC layer to form a modified ARC layer using a thermal treatment process;
forming a second layer of photo-resist on said modified ARC layer;
forming a trench pattern in said second layer of photo-resist; and
transferring said via pattern and said trench pattern to said thin film using one or more etching processes to form a dual damascene structure.

* * * * *